United States Patent
Chang et al.

(10) Patent No.: US 10,083,270 B2
(45) Date of Patent: Sep. 25, 2018

(54) TARGET OPTIMIZATION METHOD FOR IMPROVING LITHOGRAPHY PRINTABILITY

(71) Applicant: Taiwan Semiconductor Manufacturing Co., Ltd., Hsin-Chu (TW)

(72) Inventors: Shih-Ming Chang, Hsinchu County (TW); Ken-Hsien Hsieh, Taipei (TW); Shuo-Yen Chou, Hualien County (TW); Ru-Gun Liu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/379,084

(22) Filed: Dec. 14, 2016

(65) Prior Publication Data
US 2018/0165397 A1    Jun. 14, 2018

(51) Int. Cl.
*G06F 17/50* (2006.01)

(52) U.S. Cl.
CPC ...... *G06F 17/5072* (2013.01); *G06F 2217/06* (2013.01)

(58) Field of Classification Search
USPC .................. 716/51, 52, 53, 54, 55
See application file for complete search history.

(56) References Cited

U.S. PATENT DOCUMENTS

| | | | |
|---|---|---|---|
| 7,313,508 B2 * | 12/2007 | Croffie | ............... G03F 1/36 |
| | | | 430/30 |
| 8,146,026 B2 | 3/2012 | Agarwal et al. | |
| 8,527,918 B2 | 9/2013 | Cheng et al. | |
| 2012/0254813 A1 * | 10/2012 | Chen | ............... G03F 7/70433 |
| | | | 716/54 |
| 2014/0072903 A1 * | 3/2014 | Satake | ............... G06F 17/5068 |
| | | | 430/5 |

* cited by examiner

Primary Examiner — Brian Ngo
(74) Attorney, Agent, or Firm — Haynes and Boone, LLP

(57) ABSTRACT

Target optimization methods are disclosed herein for enhancing lithography printability. An exemplary method includes receiving an IC design layout for a target pattern, wherein the target pattern has a corresponding target contour; modifying the target pattern, wherein the modified target pattern has a corresponding modified target contour; and generating an optimized target pattern when the modified target contour achieves functionality of the target pattern as defined by a constraint layer. The method can further include defining a cost function based on the constraint layer, where the cost function correlates a spatial relationship between a contour of the target pattern and the constraint layer.

20 Claims, 8 Drawing Sheets

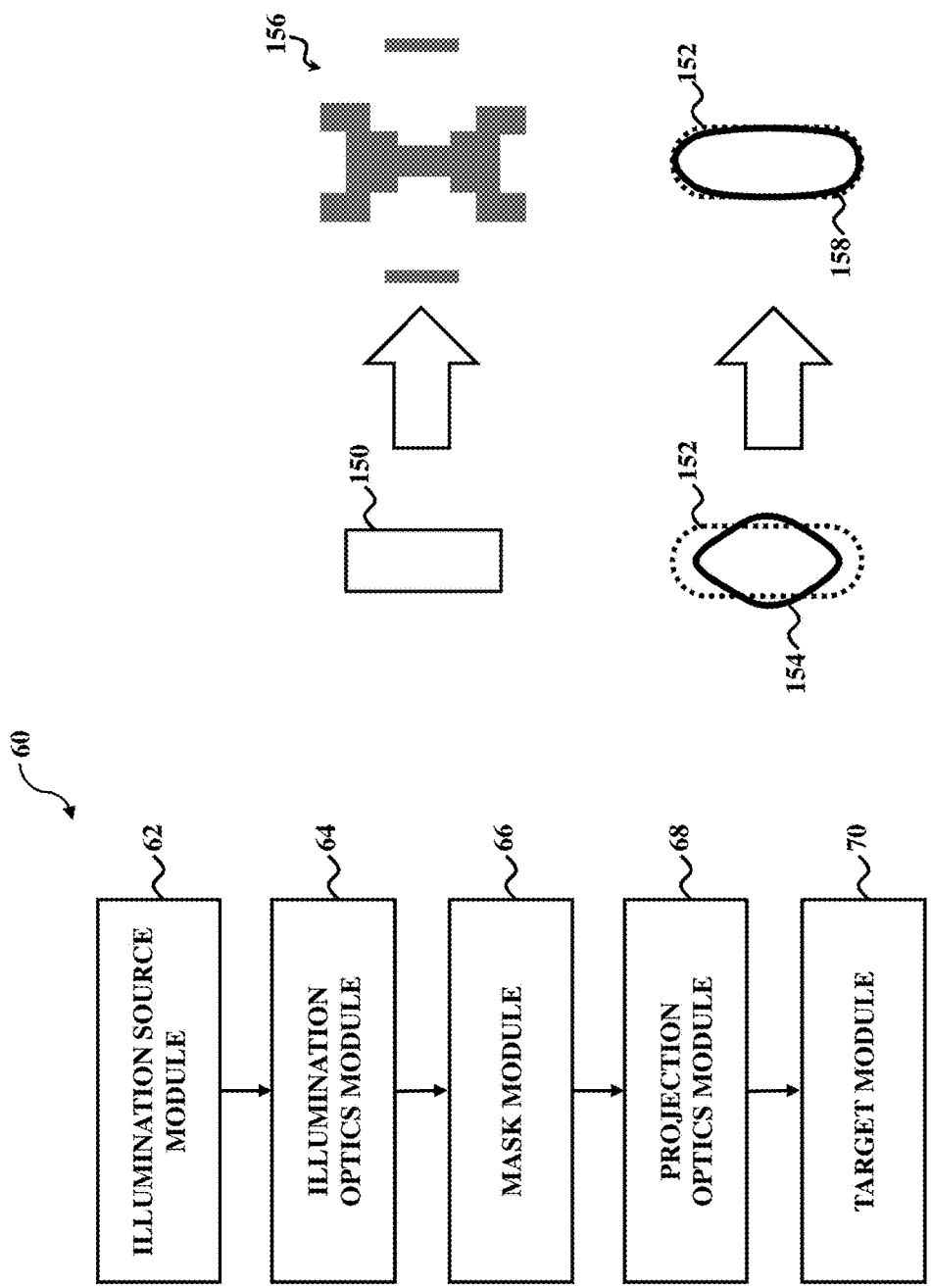

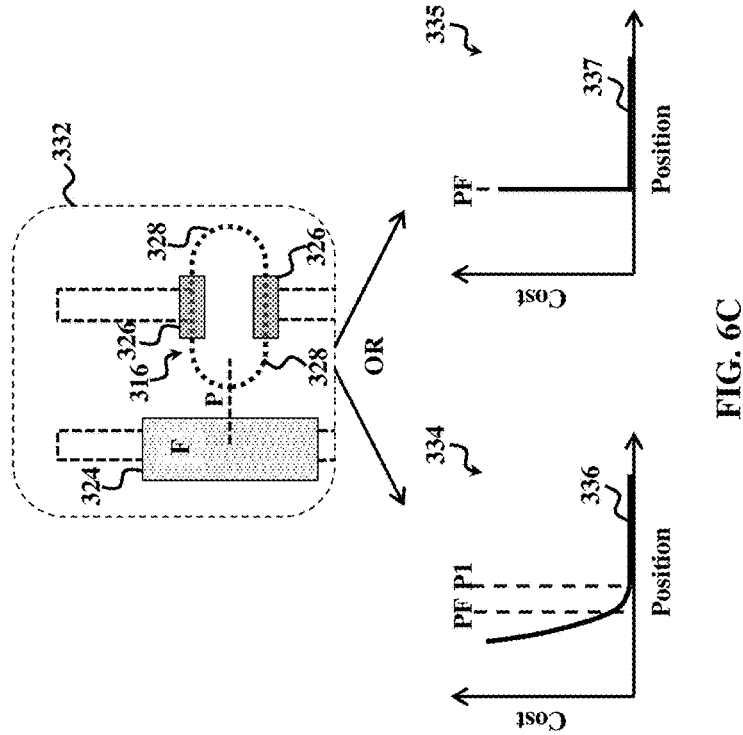
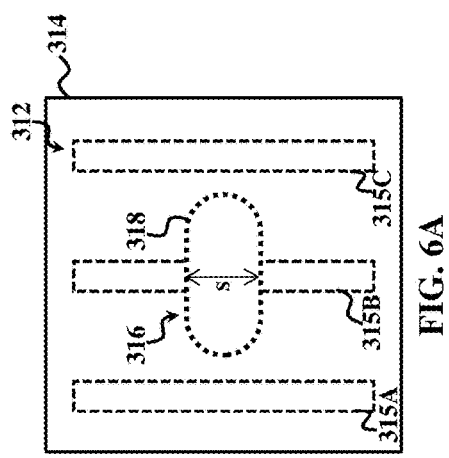
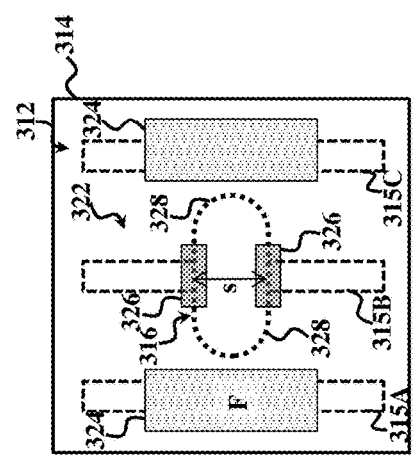

TARGET OPTIMIZATION METHOD FOR IMPROVING LITHOGRAPHY PRINTABILITY

BACKGROUND

Integrated circuit (IC) design becomes more challenging as IC technologies continually progress towards smaller feature sizes, such as 32 nanometers, 28 nanometers, 20 nanometers, and below. For example, when fabricating IC devices, IC device performance is seriously influenced by lithography printability capability, which indicates how well a final wafer pattern formed on a wafer corresponds with a target pattern defined by an IC design layout. Various methods that focus on optimizing a mask used for projecting an image that corresponds with the target pattern on the wafer have been introduced for enhancing lithography printability, such as optical proximity correction (OPC), mask proximity correction (MPC), inverse lithography technology (ILT), and source mask optimization (SMO). Although such methods have been generally adequate for their intended purposes, they have not been entirely satisfactory in all respects

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion

FIG. 2 is a simplified block diagram of an optical lithography system, which can be implemented by the IC manufacturing system of FIG. 1, according to various aspects of the present disclosure.

FIG. 3 is a simplified schematic illustrating an OPC-based computational lithography process, which can be implemented by the IC manufacturing system of FIG. 1, according to various aspects of the present disclosure.

FIG. 6A is a simplified schematic diagrammatic view of a target pattern defined by an IC design layout for fabricating an IC feature, such as the IC feature of FIG. 4, according to various aspects of the present disclosure.

FIG. 6B is a simplified schematic diagrammatic view of a constraint layer that can be defined for a target pattern, such as the target pattern depicted in FIG. 6A, according to various aspects of the present disclosure.

FIG. 6C is a simplified schematic diagrammatic view of a cost function defined for the target pattern based on a constraint layer, such as the constraint layer depicted in FIG. 6B, according to various aspects of the present disclosure.

DETAILED DESCRIPTION

Figure 1:
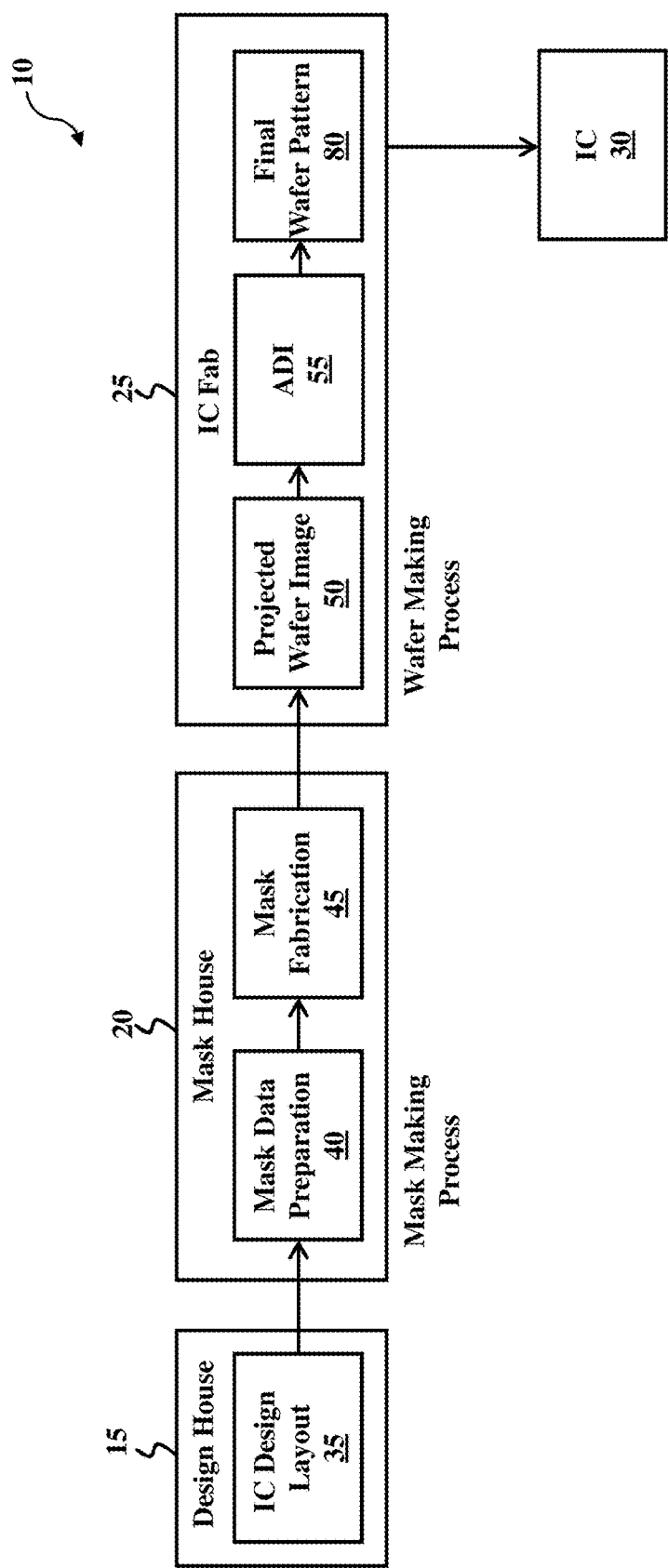
FIG. 1 is a simplified block diagram of an integrated circuit (IC) manufacturing system, along with an IC manufacturing flow associated with the IC manufacturing system, according to various aspects of the present disclosure.

The present disclosure relates generally to lithography process optimization, and more particularly, to target optimization processes for enhancing lithography printability.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a simplified block diagram of an integrated circuit (IC) manufacturing system 10, along with an IC manufacturing flow associated with IC manufacturing system 10, according to various aspects of the present disclosure. IC manufacturing system 10 includes a plurality of entities, such as a design house (or design team) 15, a mask house 20, and an IC manufacturer 25 (for example, an IC fab), that interact with one another in design, development, and manufacturing cycles and/or services related to manufacturing an IC device 30. The plurality of entities is connected by a communication network, which may be a single network or a variety of different networks, such as an intranet and/or Internet, and may include wired and/or wireless communication channels. Each entity may interact with other entities and may provide services to and/or receive services from the other entities. One or more of design house 15, mask house 20, and IC manufacturer 25 may be owned by a single large company, and may even coexist in a common facility and use common resources.

Design house 15 generates an IC design layout 35 (also referred to as an IC design pattern). IC design layout 35 includes various circuit patterns (represented by geometrical shapes) designed for an IC product based on specifications of an IC product to be manufactured. The circuit patterns correspond to geometrical patterns formed in various material layers (such as metal layers, dielectric layers, and/or semiconductor layers) that combine to form IC features (components) of the IC product, such as IC device 30. For example, a portion of IC design layout 35 includes various IC features to be formed in a substrate (for example, a silicon substrate) and/or in various material layers disposed on the substrate. The various IC features can include an active region, a gate feature (for example, a gate dielectric and/or a gate electrode), a source/drain feature, an interconnection feature, a bonding pad feature, other IC feature, or combinations thereof. In some implementations, assist features are inserted into IC design layout 35 to provide imaging effects, process enhancements, and/or identification information. A geometry proximity correction (GPC) process, similar to an optical proximity correction (OPC) process used for optimizing mask patterns (mask layouts), may generate the assist features based on environmental impacts associated with IC fabrication, including etching loading effects, patterning loading effects, and/or chemical mechanical polishing (CMP) process effects. Design house 15 implements a proper design procedure to form IC design layout 35. The design procedure may include logic design, physical design, place and route, or combinations thereof. IC design layout 35 is presented in one or more data files having information of the circuit patterns (geometrical patterns). For example, IC design layout 35 is expressed in a Graphic Database System file format (such as GDS or GDSII). In another example, IC design layout 35 is expressed in another suitable file format, such as Open Artwork System Interchange Standard file format (such as OASIS or OAS).

Mask house 20 uses IC design layout 35 to manufacture one or more masks, which are used for fabricating various layers of IC device 30 according to IC design layout 35. A mask (also referred to as a photomask or reticle) refers to a patterned substrate used in a lithography process to pattern a wafer, such as a semiconductor wafer. Mask house 20 performs mask data preparation 40, where IC design layout 35 is translated into a form that can be written by a mask writer to generate a mask. For example, IC design layout 35 is translated into machine readable instructions for a mask writer. Mask data preparation 40 generates a mask pattern (mask layout) that corresponds with a target pattern defined by the design layout 35. The mask pattern is generated by fracturing the target pattern of IC design layout 35 into a plurality of mask features (mask regions) suitable for a mask making lithography process. The fracturing process is implemented according to various factors, such as IC feature geometry, pattern density differences, and/or critical dimension (CD) differences, and the mask features are defined based on methods implemented by the mask writer for printing mask patterns. In some implementations, a mask pattern is generated by fracturing IC design layout 35 into polygons (such as rectangles or trapezoids), where exposure information is generated for each polygon. Exposure information can define an exposure dose, an exposure time, and/or an exposure shape, for each polygon. As described in detail below, mask data preparation 40 can implement various processes for optimizing the mask pattern, such that a final pattern formed on a wafer (often referred to as a final wafer pattern) by a lithography process using a mask fabricated from the mask pattern exhibits enhanced resolution and precision.

Mask house 20 also performs mask fabrication 45, where a mask is fabricated according to the mask pattern generated by mask data preparation 40. In some implementations, the mask pattern is modified during mask fabrication 45 to comply with a particular mask writer and/or mask manufacturer. During mask fabrication 45, a mask making process is implemented that fabricates a mask based on the mask pattern (mask layout). The mask includes a mask substrate and a patterned mask layer, where the patterned mask layer includes a final (real) mask pattern. The final mask pattern, such as a mask contour, corresponds with the mask pattern (which corresponds with the target pattern provided by IC design layout 35). In some implementations, the mask is a binary mask. In such implementations, according to one example, an opaque material layer (such as chromium) is formed over a transparent mask substrate (such as a fused quartz substrate or calcium fluoride ($CaF_2$)), and the opaque material layer is patterned based on the mask pattern to form a mask having opaque regions and transparent regions. In some implementations, the mask is a phase shift mask (PSM) that can enhance imaging resolution and quality, such as an attenuated PSM or alternating PSM. In such implementations, according to one example, a phase shifting material layer (such as molybdenum silicide (MoSi) or silicon oxide ($SiO_2$)) is formed over a transparent mask substrate (such as a fused quartz substrate or calcium fluoride ($CaF_2$)), and the phase shifting material layer is patterned to form a mask having partially transmitting, phase shifting regions and transmitting regions that form the mask pattern. In another example, the phase shifting material layer is a portion of the transparent mask substrate, such that the mask pattern is formed in the transparent mask substrate. In some implementations, the mask is an extreme ultraviolet (EUV) mask. In such implementations, according to one example, a reflective layer is formed over a substrate, an absorption layer is formed over the reflective layer, and the absorption layer (such as a tantalum boron nitride (TaBN)) is patterned to form a mask having reflective regions that form the mask pattern. The substrate includes a low thermal expansion material (LTEM), such as fused quartz, $TiO_2$ doped $SiO_2$, or other suitable low thermal expansion materials. The reflective layer can include multiple layers formed on the substrate, where the multiple layers include a plurality of film pairs, such as molybdenum-silicide (Mo/Si) film pairs, molybdenum-beryllium (Mo/Be) film pairs, or other suitable material film pairs configured for reflecting EUV radiation (light). The EUV mask may further include a capping layer (such as ruthenium (Ru)) disposed between the reflective layer and the absorption layer. Alternatively, another reflective layer is formed over the reflective layer and patterned to form an EUV phase shift mask.

Mask fabrication 45 can implement various lithography processes for fabricating the mask. For example, the mask making process includes a lithography process, which involves forming a patterned energy-sensitive resist layer on a mask material layer and transferring a pattern defined in the patterned resist layer to the mask patterning layer. The mask material layer is an absorption layer, a phase shifting material layer, an opaque material layer, a portion of a mask substrate, and/or other suitable mask material layer. In some implementations, forming the patterned energy-sensitive resist layer includes forming an energy-sensitive resist layer on the mask material layer (for example, by a spin coating process), performing a charged particle beam exposure process, and performing a developing process. The charged particle beam exposure process directly "writes" a pattern into the energy-sensitive resist layer using a charged particle beam, such as an electron beam or an ion beam. Since the energy-sensitive resist layer is sensitive to charged particle beams, exposed portions of the energy-sensitive resist layer chemically change, and exposed (or non-exposed) portions of the energy-sensitive resist layer are dissolved during the developing process depending on characteristics of the energy-sensitive resist layer and characteristics of a developing solution used in the developing process. After development, the patterned resist layer includes a resist pattern that corresponds with the mask pattern. The resist pattern is then transferred to the mask material layer by any suitable process, such that a final mask pattern is formed in the mask material layer. For example, the mask making process can include performing an etching process that removes portions of the mask material layer, where the etching process uses the patterned energy-sensitive resist layer as an etch mask during the etching process. After the etching process, the lithography process can include removing the patterned energy-sensitive resist layer from the mask material layer, for example, by a resist stripping process.

IC manufacturer 25, such as a semiconductor foundry, uses the mask (or masks) fabricated by mask house 20 to fabricate IC device 30. For example, a wafer making process is implemented that uses a mask to fabricate a portion of IC device 30 on a wafer, such as a semiconductor wafer. In some implementations, IC manufacturer 25 performs wafer making process numerous times using various masks to complete fabrication of IC device 30. Depending on the IC fabrication stage, the wafer can include various material layers and/or IC features (for example, doped features, gate features, and/or interconnect features) when undergoing the wafer making process. The wafer making process includes a lithography process, which involves forming a patterned resist layer on a wafer material layer using a mask, such as the mask fabricated by mask house 20, and transferring a pattern defined in the patterned resist layer to the wafer material layer. The wafer material layer is a dielectric layer, a semiconductor layer, a conductive layer, a portion of a substrate, and/or other suitable wafer material layer.

Forming the patterned resist layer can include forming a resist layer on the wafer material layer (for example, by spin coating), performing a pre-exposure baking process, performing an exposure process using the mask (including mask alignment), performing a post-exposure baking process, and performing a developing process. During the exposure process, the resist layer is exposed to radiation energy (such as ultraviolet (UV) light, deep UV (DUV) light, or extreme UV (EUV) light) using an illumination source, where the mask blocks, transmits, and/or reflects radiation to the resist layer depending on a final mask pattern of the mask and/or mask type (for example, binary mask, phase shift mask, or EUV mask), such that an image is projected onto the resist layer that corresponds with the final mask pattern. This image is referred to herein as a projected wafer image 50. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the final mask pattern. An after development inspection (ADI) 55 can be performed to capture information associated with the resist pattern, such as critical dimension uniformity (CDU) information, overlay information, and/or defect information.

FIG. 2 is a simplified block diagram of an optical lithography system 60 for imaging a pattern of a mask onto a workpiece, which can be implemented by IC fab 25, according to various aspects of the present disclosure. The workpiece includes a wafer, a mask, or any base material on which processing is conducted to produce layers of material configured to form IC patterns and/or IC features. In some implementations, the workpiece is a wafer having a radiation sensitive layer (for example, a resist layer) disposed thereover. In FIG. 2, optical lithography system 60 includes an illumination source module 62, an illumination optics module 64, a mask module 66, projection optics module 68, and a target module 70. Illumination source module 62 includes a radiation source that generates and emits radiation (light) of a suitable wavelength, such as UV radiation, DUV radiation, EUV radiation, other suitable radiation, or a combination thereof. Illumination optics module 64 collects, guides, and directs the radiation, such that the radiation is projected onto a mask. Mask module 66 includes a mask stage for holding the mask and manipulating a position of the mask. The mask transmits, absorbs, and/or reflects the radiation depending on a final mask pattern of the mask, along with mask technologies used to fabricate the mask, thereby projecting patterned radiation. Projection optics module 68 collects, guides, and directs the patterned radiation from mask module 66 to a workpiece of target module 70, such that an image of the mask (corresponding with the final mask pattern) is projected onto the workpiece. Target module 70 can include a wafer stage for holding the workpiece and manipulating a position of the workpiece. In some implementations, target module 70 provides control of a position of the workpiece, such that an image of the mask can be scanned onto the workpiece in a repetitive fashion (though other scanning methods are possible). In some implementations, illumination optics module 64 includes various optical components for collecting, directing, and shaping the radiation onto the mask, and projection optics module 68 includes various optical components for collecting, directing, and shaping the patterned radiation onto the workpiece. Such optical components include refractive components, reflective components, magnetic components, electromagnetic components, electrostatic components, and/or other types of components for collecting, directing, and shaping the radiation. FIG. 2 has been simplified for the sake of clarity to better understand the inventive concepts of the present disclosure. Additional features can be added in optical lithography system 60, and some of the features described below can be replaced, modified, or eliminated for additional embodiments of optical lithography system 60.

Turning again to FIG. 1 and the wafer making process implemented by IC manufacturer 25, transferring the resist pattern defined in the patterned resist layer to the wafer material layer is accomplished in numerous ways, such that a final wafer pattern 80 is formed in the wafer material layer. For example, the wafer making process can include performing an implantation process to form various doped regions/features in the wafer material layer, where the patterned resist layer is used as an implantation mask during the implantation process. In another example, the wafer making process can include performing an etching process that removes portions of the wafer material layer, where the etching process uses the patterned resist layer as an etch mask during the etching process. After the implantation process or the etching process, the lithography process includes removing the patterned resist layer from the wafer, for example, by a resist stripping process. In yet another example, the wafer making process can include performing a deposition process that fills openings in the patterned resist layer (formed by the removed portions of the resist layer) with a dielectric material, a semiconductor material, or a conductive material. In such implementations, removing the patterned resist layer leaves a wafer material layer that is patterned with a negative image of the patterned resist layer. An after etch inspection (AEI) can be performed to capture information, such as CDU, associated with the final wafer pattern 80 formed in the wafer material layer.

Ideally, final wafer pattern 80 matches the target pattern defined by IC design layout 35. However, due to various factors associated with the mask making process and the wafer making process, the final mask pattern formed on the mask often varies from the mask pattern (generated from the target pattern defined by IC design layout 35), causing final wafer pattern 80 formed on the wafer to vary from the target pattern. For example, mask writing blur (such as e-beam writing blur) and/or other mask making factors cause variances between the final mask pattern and the mask pattern, which causes variances between final wafer pattern 80 and the target pattern. Various factors associated with the wafer making process (such as resist blur, mask diffraction, projection imaging resolution, acid diffusion, etching bias, and/or other wafer making factors) further exacerbate the variances between final wafer pattern 80 and the target pattern.

Computational lithography has been introduced for enhancing and optimizing the mask masking process and the wafer making process, thereby minimizing variances between final wafer pattern 80 and the target pattern. Computational lithography generally refers to any technique implementing computationally-intensive physical models and/or empirical models to predict and optimize IC feature patterning, where the physical models and/or the empirical models are based on phenomena that affect lithographic process results, such as imaging effects (for example, diffraction and/or interference) and/or resist chemistry. IC manufacturing system 10 can implement such techniques to generate optimal settings for illumination optics module 64 (often referred to as source optimization), mask module 66 (often referred to as mask optimization), projection optics module 68 (often referred to as wave front engineering), and/or target module 70 (often referred to as target optimization). For example, IC manufacturing system 10 can implement source mask optimization (SMO) to generate a shape for a final mask pattern of a mask (fabricated by mask house 20) and a shape of radiation for exposing the mask (provided by illuminations optics module 64) that optimizes projected wafer image 50. In another example, IC manufacturing system 10 can implement wave front engineering to generate settings for projection optics module 68 that optimize projected wafer image 50. In yet another example, IC manufacturing system 10 can implement optical proximity correction (OPC), mask rule check (MRC), lithographic process check (LPC), and/or inverse lithography technology (ILT) techniques to generate a shape for a final mask pattern of a mask (fabricated by mask house 20) that optimizes projected wafer image 50.

Turning to FIG. 3, FIG. 3 is a simplified schematic illustrating an OPC-based computational lithography process, which can be performed at mask data preparation 40, according to various aspects of the present disclosure. For example, a target pattern includes a target feature 150 to be formed on a wafer. A target contour 152 defines a shape of a pattern printed (imaged) on the wafer by exposing a mask that includes target feature 150 given ideal lithographic process conditions. Even with ideal lithographic process conditions, lithography constraints prevent target feature 150 from being printed on the wafer with corners formed by right angles, such that target contour 152 exhibits rounded corners. A predicted contour 154 represents a pattern printed on the wafer by exposing the mask that includes target feature 150 given predicted lithographic process conditions. In some implementations, mask data preparation 40 can implement a LPC process to generate predicted contour 154. The LPC process simulates an image of a mask based on a generated mask pattern using various LPC models (or rules), which may be derived from actual (historic) processing data associated with IC fab 25 fabricating IC devices. The processing data can include processing conditions associated with various processes of the IC manufacturing cycle, conditions associated with tools used for manufacturing the IC, and/or other aspects of the manufacturing process. The LPC process takes into account various factors, such as image contrast, depth of focus, mask error sensitivity, other suitable factors, or combinations thereof.

As depicted in FIG. 3, since predicted contour 154 varies greatly from target contour 152, OPC is performed to modify the target pattern until a predicted contour fits target contour 152, thereby generating an OPC-modified target pattern. For example, target feature 150 is transformed into an OPC-modified target feature 156 to compensate for lithographic process conditions that cause such variances, such that a predicted contour 158 is generated that fits target contour 152, significantly improving lithography printability. Predicted contour 158 represents a pattern printed on the wafer by exposing a mask that includes OPC-modified target feature 156 given predicted lithographic process conditions. In some implementations, an LPC process generates predicted contour 158. OPC uses lithography enhancement techniques to compensate for image distortions and errors, such as those that arise from diffraction, interference, or other process effects. OPC can add assistant features (AFs), such as scattering bars, serifs, and/or hammerheads, to the target pattern (here, target feature 150) or modify (such as resize, reshape, and/or reposition) the target pattern according to optical models (referred to as model-based OPC) and/or optical rules (referred to as rule-based OPC), such that after a lithography process, a final wafer pattern exhibits enhanced resolution and precision. In some implementations, OPC distorts the target pattern to balance image intensity, for example, removing portions of the target pattern to reduce over-exposed regions and adding AFs to the target pattern to enhance under-exposed regions. In some implementations, AFs compensate for line width differences that arise from different densities of surrounding geometries. In some implementations, AFs can prevent line end shortening and/or line end rounding. OPC can further correct for e-beam proximity effects and/or perform other optimization features.

In some implementations, the OPC process and the LPC process are iterative processes, where multiple iterations (for example, modifications and simulations) are performed to generate OPC-modified target feature 156. In some implementations, target contour 152 is represented by a plurality of target points generated by an OPC process along a perimeter defining target feature 150 (here, target contour 152), and predicted contour 154 represents a perimeter defining target feature 150 generated by an LPC process. In such implementations, a dissection process may be performed on target contour 152, where target contour 152 is dissected into multiple discrete segments defined by a plurality of dissection points (also referred to as stitching points). Each segment is a portion of target contour 152 defined between adjacent dissection points. Then, at least one target point may be assigned to each segment, such that target points are spaced at locations along target contour 152. In some implementations, the OPC process modifies target feature 150 until distances between target points of target contour 152 and a predicted contour fall within an acceptable distance range. In some implementations, mask data preparation 40 can further implement an MRC process that checks the mask pattern after undergoing OPC, where the MRC process uses a set of mask creation rules. The mask creation rules can define geometric restrictions and/or connectivity restrictions to avoid various issues and/or failures that can arise from variations in IC manufacturing processes. FIG. 3 has been simplified for the sake of clarity to better understand the inventive concepts of the present disclosure. Additional features can be added in the OPC-based computational lithography process, and some of the features described below can be replaced, modified, or eliminated for additional embodiments of the OPC-based computational lithography process.

OPC-based computational lithography techniques and computational lithography techniques generally often aim to minimize a cost function that defines a variance between a predicted contour and a target contour, such as an edge placement error (EPE). The cost function can further correlate such variance with various penalties arising from process constraints related to the lithography process, such as an MRC penalty and/or an AF printing penalty. Though an optimized target pattern that exhibits a predicted contour with minimal variance from the target contour can be generated by such techniques, a shape of the target contour can negatively influence process windows. For example, obtaining a target contour with sharp corners under nominal conditions results in low contrast and/or low depth of focus. However, not every segment of a target contour has a distinct target. For example, a shape of the target contour can be varied (for example, to have rounded corners instead of sharp corners), yet still achieve desired functionality of the target pattern.

Figure 4:
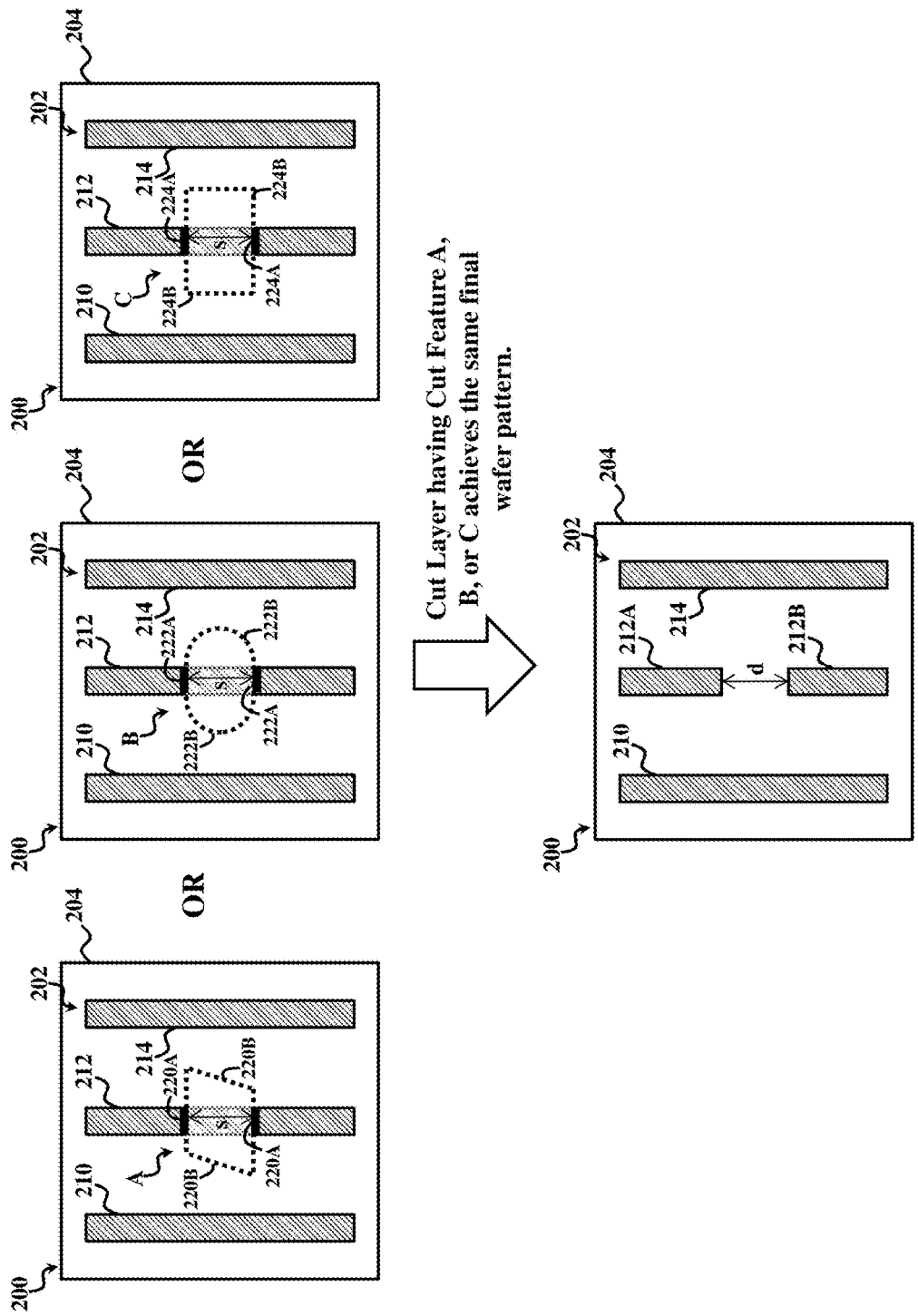
FIG. 4 illustrates different target cut contours that can a target pattern can exhibit to fabricate a same IC feature according to various aspects of the present disclosure.

Turning to FIG. 4, FIG. 4 illustrates different cut features that can be implemented in a cutting pattern to achieve a same IC feature for a semiconductor device 200 according to various aspects of the present disclosure. Semiconductor device 200 includes a wafer that includes various wafer material layers (for example, dielectric layers, semiconductor layers, and/or conductive layers) configured to form IC features (for example, doped features, gate features, and/or interconnect features) depending on IC fabrication stage. For example, in the depicted embodiment, the wafer includes a wafer material layer 202 formed over a substrate 204, such as a silicon substrate. Wafer material layer 202 includes various conductive lines, such as a conductive line 210, a conductive line 212, and a conductive line 214. In some implementations, conductive line 210, conductive line 212, and conductive line 214 are configured to form gate features, such as polysilicon gate features, of semiconductor device 200. Semiconductor device 200 may be a portion of an IC chip, a system on chip (SoC), or portion thereof, that includes various passive and active microelectronic devices, such as resistors, capacitors, inductors, fuses, diodes, P-channel field effect transistors (PFETs), N-channel FETs (NFETs), metal-oxide-semiconductor FETs (MOSFETs), complementary MOS (CMOS) transistors, high voltage transistors, high frequency transistors, other suitable components, or combinations thereof. FIG. 4 has been simplified for the sake of clarity to better understand the inventive concepts of the present disclosure. Additional features can be added in semiconductor device 200, and some of the features described below can be replaced, modified, or eliminated in other embodiments of semiconductor device 200.

In FIG. 4, a lithography process is performed to remove a portion of wafer material layer 202. For example, the lithography process removes a portion of conductive line 212, thereby forming a final wafer pattern that includes a conductive line 212A and a conductive line 212B spaced apart by a distance d, conductive line 210, and conductive line 214. In some implementations, the lithography process includes forming a patterned resist layer (also referred to as a cut layer) over wafer material layer 202 using a cut mask and transferring a cutting pattern defined in the patterned resist layer to wafer material layer 202. Forming the patterned resist layer can include forming a resist layer on wafer material layer 202 (for example, by spin coating), performing a pre-exposure baking process, performing an exposure process using the cut mask, performing a post-exposure baking process, and performing a developing process. During the exposure process, the resist layer is exposed to radiation energy using an illumination source, where the cut mask blocks, transmits, and/or reflects radiation to the resist layer depending on the cutting pattern of the cut mask and/or mask type (for example, binary mask, phase shift mask, or EUV mask), such that an image is projected onto the resist layer that corresponds with the cutting pattern (referred to as a projected cut image). Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the cutting pattern. In some implementations, an etching process is used to transfer the resist pattern to wafer material layer 202. For example, the resist pattern (the cutting pattern) exposes a portion of conductive line 212, such that the etching process removes the exposed portion of conductive line 212 using the patterned resist layer as an etch mask, thereby forming conductive line 212A and conductive line 212B.

Because only specific segments (edges) of a cut feature formed in the patterned resist layer (cut layer) define the final wafer pattern, the patterned resist layer can achieve the same final wafer pattern with cut features having different contours. For example, though a cut feature A has a generally parallelogram-shaped contour, a cut feature B has a generally oval-shaped contour, and a cut feature C has a generally rectangular-shaped contour, segments of the contours of cut features A-C that cut conductive line 212 are the same, such that patterned resist layer can include cut feature A, cut feature B, or cut feature C to form the final wafer pattern depicted in FIG. 4. In particular, contours of cut features A-C respectively include cut segments 220A, cut segments 222A, and cut segments 224A that define cut edges in the patterned resist layer, where cut segments 220A, cut segments 222A, and cut segments 224A each define a line end spacing s that corresponds with distance d (for example, line end spacing s is about equal to distance d). In contrast, contours of cut features A-C also respectively include segments 220B, segments 222B, and segments 224B, which have no significance to the cutting process. Accordingly, considering functionality of the patterned resist layer, cut features A-C are all the same so long as cut segments 220A, cut segments 222A, and cut segments 224A achieve the same function—here, defining the same portion of conductive line 212 to be removed to achieve line end spacing s. A contour of a cut feature formed in the patterned resist layer can thus exhibit any shape so long as the contour of the cut feature achieves desired functionality for the patterned resist layer (here, to cut wafer material layer 202 as depicted in FIG. 4).

Figure 5:
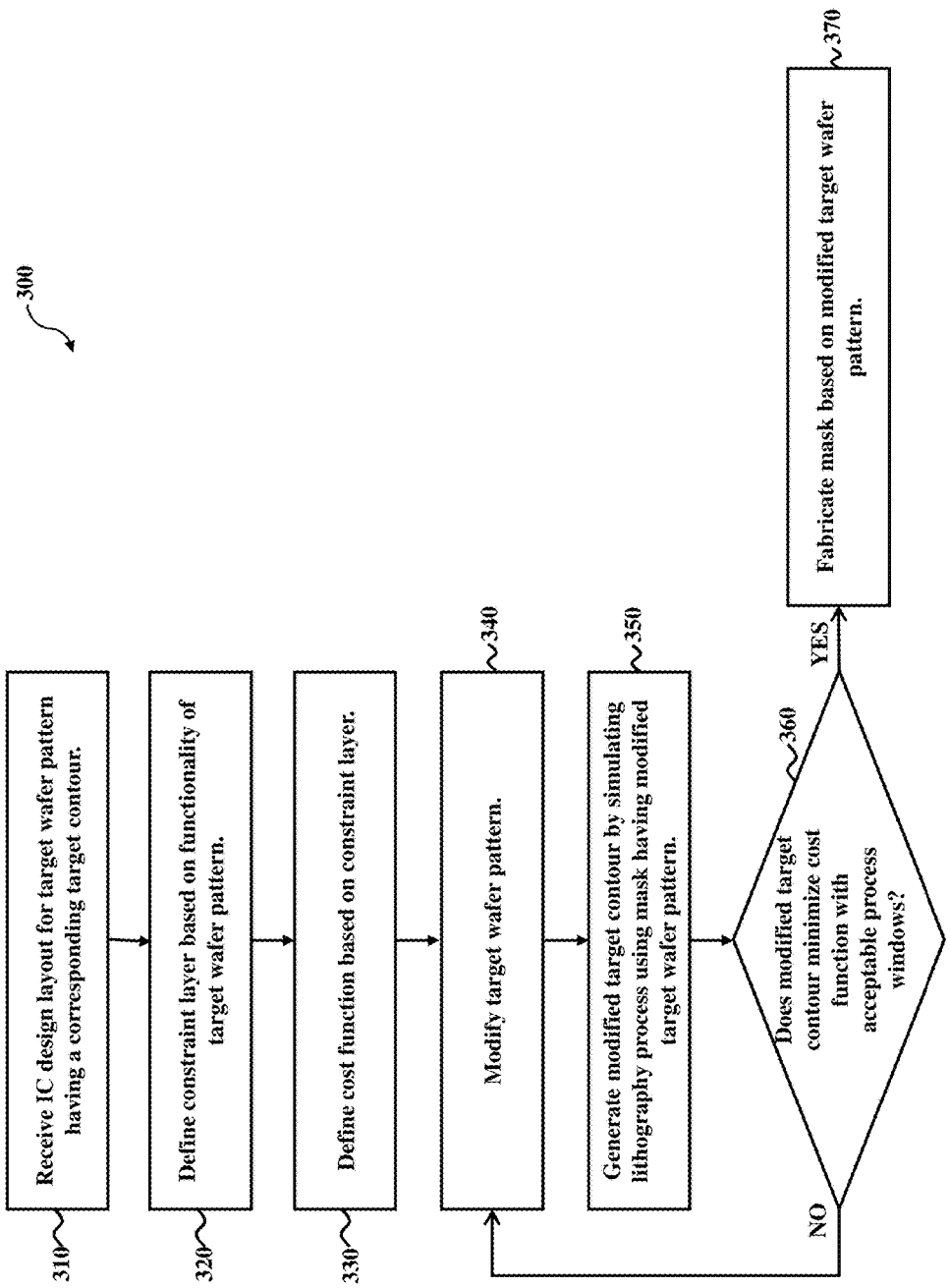
FIG. 5 is a flowchart of computational lithography method, which can be implemented by the IC manufacturing system of FIG. 1 for target optimization, according to various aspects of the present disclosure.

Turning to FIG. 5, FIG. 5 is a flowchart of computational lithography method 300, which can be implemented by IC manufacturing system 10 of FIG. 1, according to various aspects of the present disclosure. As described below, computational lithography method 300 focuses on functionality of a target pattern and/or a target contour of the target pattern when optimizing a contour of the target pattern, instead of solely on a shape of the target contour. For example, computational lithography method 300 generates an optimized target pattern when a predicted target wafer contour (corresponding with a modified target pattern) satisfies functionality of the target pattern as defined by an IC design layout. Design house 15, mask house 20, and/or IC manufacturer 25 can perform method 300. In some implementations, design house 15, mask house 20, and/or IC manufacturer 25 collaborate to perform method 300. In some implementations, computational lithography method 300 is implemented by mask data preparation 40 of IC manufacturing system 10. FIG. 5 has been simplified for the sake of clarity to better understand the inventive concepts of the present disclosure. Additional features can be added in computational lithography method 300, and some of the features described below can be replaced, modified, or eliminated for additional embodiments of computational lithography method 300.

At block 310, computational lithography method 300 includes receiving an IC design layout, such as IC design layout 35, which defines a target pattern. The IC design layout is presented in one or more data files having information of the target pattern. For example, the IC design layout is received in a GDSII file format or an OASIS file format. For purposes of the following discussion, the target pattern includes a gate pattern for a gate mask to be used, for example, to form gate lines and a cutting pattern for a cut mask to be used, for example, to remove a portion of the gate lines, thereby forming gate features of an IC device, such as IC device 30. In this regard, FIG. 6A is a simplified schematic diagrammatic view of a gate pattern 312 in relation to a cutting pattern 314, both of which can be defined by the IC design layout to fabricate gate features as depicted in FIG. 4, according to various aspects of the present disclosure. For example, gate pattern 312 and cutting pattern 314 combine to form a final wafer pattern that includes conductive line 210, conductive line 212A and conductive line 212B spaced apart by distance d, and conductive line 214. A gate mask including gate pattern 312 can be used to form wafer material layer 202 over substrate 204, and a cut mask including cutting pattern 314 can be used to pattern wafer material layer 202. In FIG. 6A, cutting pattern 314 is shown overlying gate pattern 312, which includes a target line feature 315A that corresponds with conductive line 210, a target line feature 315B that corresponds with conductive line 212, and a target line feature 315C that corresponds with conductive line 214. Cutting pattern 314 includes a target cut feature 316 similar to cut feature B in FIG. 4. Cutting pattern 314 is configured relative to gate pattern 312, such that when target cut feature 316 is formed in a resist layer, a target cut contour 318 of target cut feature 316 overlaps and exposes a portion of conductive line 212 to be removed (for example, by an etching process). Target cut contour (boundary) 318 defines a shape of target cut feature 316 that will be printed (imaged) on the resist layer by exposing the cut mask given ideal lithographic process conditions. However, as noted above, lithographic constraints often cause a final wafer pattern to vary from the target pattern, such that a final cut contour on the wafer will vary from target cut contour 318.

Turning again to FIG. 5, computational lithography method 300 proceeds with modifying the target pattern to generate an optimized target contour, which when printed (imaged) on the resist layer optimizes the final wafer pattern. At block 320, computational lithography method 300 proceeds with defining a constraint layer based on functionality of the target pattern. The constraint layer defines at least one region, area, segment, edge, and/or feature corresponding with the target pattern that constrains a shape of an optimized target contour generated by computational lithography method 300, such that the optimized target contour maintains functionality of the target pattern as defined by the IC design layout. Functionality of the target pattern generally refers to process characteristics, electrical characteristics, spatial characteristics, physical characteristics, and/or other characteristics defined for the target pattern by the IC design layout.

In some implementations, the constraint layer is based on process constraints for a wafer material layer to be processed (referred to herein as a process layer N) based on the target pattern, previously processed wafer material layers (for example, process layers N−1, N−2, N−3, etc.), and/or subsequently processed wafer material layers (for example, process layers N+1, N+2, N+3, etc.). For example, the constraint layer includes a forbidden region (area) of the target pattern, where the forbidden region defines a portion of the target pattern that the optimized target contour cannot expose, touch, and/or overlap to ensure that the IC device exhibits desired characteristics. In another example, the constraint layer includes a landing region (area) of the target pattern, where the landing region defines a portion of the target pattern that the optimized target contour must expose, touch, overlap, and/or cover to ensure that the IC device exhibits desired characteristics.

In some implementations, the constraint layer is based on a functional segment and/or a non-functional segment of the target contour, where the functional segment defines a portion of the target contour that contributes to the functionality of the target pattern and the non-functional segment defines a portion of the target contour that does not contribute to the functionality of the target pattern. For example, any portion of the target contour that defines an end-to-end spacing, a critical dimension, a pitch, and/or other defining characteristic of the target pattern is defined as a functional segment. Then, when modifying the target pattern, computational lithography method 300 focuses on the functional segment when comparing a shape of the optimized target contour to the target contour, ensuring that a shape of the optimized target contour fits the target contour at the functional segment. In some implementations, a shape of the optimized target contour fits the target contour at the functional segment within a defined threshold range. In some implementations, a shape of the optimized target contour at the functional segment minimizes edge placement error (EPE) between the optimized target contour and the target contour for all process conditions.

FIG. 6B is a simplified schematic diagrammatic view of a constraint layer 322 that can be defined for a target pattern, such as cutting pattern 314 depicted in FIG. 6A, according to various aspects of the present disclosure. Constraint layer 322 restricts a shape of an optimized cut contour that corresponds with target cut feature 316 as computational lithography method 300 modifies cutting pattern 314. For example, a shape of the optimized cut contour for target cut feature 316 in cutting pattern 314 is constrained by previously processed wafer material layer 202 (in other words, process layer N−1), which is fabricated according to gate pattern 312. In particular, to ensure that portions of conductive line 210 and conductive line 214 are not removed during the cutting process, constraint layer 322 defines forbidden regions 324 of cutting pattern 314 based on gate pattern 312. Forbidden regions 324 define portions of cutting pattern 314 that the optimized cut contour of target cut feature 316 cannot expose, touch, and/or overlap to ensure that a physical layout of the final wafer pattern results in gate features as depicted in FIG. 4. In the depicted embodiment, one forbidden region 324 overlaps target line feature 315A and one forbidden region 324 overlaps target line feature 315C, such that any optimized cut contour of target cut feature 316 is prevented from touching and/or exposing conductive line 210 or conductive line 214 during processing.

Constraint layer 322 further divides target cut contour 318 into functional segments 326 and non-functional segments 328. Functional segments 326 include portions of target cut contour 318 that contribute to the functionality of cutting pattern 314, which as described herein, functions as a cut mask for a cutting process that removes a portion of conductive line 212, thereby fabricating conductive line 212A and conductive line 212B spaced apart by distance d. For example, in the depicted embodiment, functional segments 326 define cut edges of target cut feature 316, where the cut edges overlap a portion of target line feature 315B to be removed during the cutting process and define line end spacing s between the remaining portions of target line feature 315B. A shape of the optimized cut contour at functional segments 326 is thus critical to functionality of the target pattern, such that computational lithography method 300 will require minimal (to no) variance between a shape of the optimized cut contour and the shape of target cut contour 318 at functional segments 326. In some implementations, the optimized target cut feature will minimize EPE between the optimized cut contour and target cut contour 318 at functional segments 326, ensuring that line end spacing s is about equal to distance d as defined by the IC design layout. In contrast, non-functional segments 328 include portions of target cut contour 318 that do not contribute to the functionality of cutting pattern 314. For example, in the depicted embodiment, non-functional segments 328 define edges of target cut feature 316 that do not overlap target line feature 315B, such that non-functional segments 328 do not meaningfully contribute to the cutting process. A shape of the optimized cut contour at non-functional segments 328 is thus largely irrelevant, such that computational lithography method 300 can tolerate variances between the shape of the optimized cut contour and the shape of target cut contour 318 at non-functional segments 328. Accordingly, the optimized cut contour of target cut feature 316 can include any shape that maintains functional segments 326 while ensuring that non-functional segments 328 do not intrude forbidden regions 324, providing significant optimization flexibility.

Turning again to FIG. 5, at block 330, computational lithography method 300 proceeds with defining a cost function based on the constraint layer. The cost function correlates a spatial relationship between the constraint layer and a contour of the target pattern, defining a penalty cost based on the spatial relationship. In some implementations, the penalty cost is defined based on a spatial relationship of the constraint layer relative to the contour of the target pattern, where the penalty cost increases or decreases as the contour approaches the constraint layer. In some implementations, the penalty cost is defined based on a spatial relationship of forbidden regions relative to the contour, where penalty cost increases as the contour approaches forbidden regions. In some implementations, the penalty cost is defined based on a spatial relationship of landing regions relative to the contour of the target pattern, where penalty cost increases as the contour approaches landing regions. In some implementations, the penalty cost is defined based on a spatial relationship between a contour of the target pattern and the target contour of the target pattern at functional segments. The cost function considers variations of process conditions associated with forming a modified target pattern associated with the modified target contour on a wafer. In some implementations, the process conditions are associated with using a mask that includes the modified target pattern to form an image on the wafer that corresponds with the modified target contour. Such process conditions can include defocus conditions, exposure conditions (energy bias), and/or mask conditions (mask bias) associated with imaging the modified target pattern on the wafer. Using the cost function, computational lithography method 300 can thus generate a modified target pattern having a modified target contour (in other words, predicted contour) that achieves functionality of the target pattern, instead of modifying the target pattern solely to achieve a modified target contour that matches the target contour.

Recalling cutting pattern 314 and corresponding constraint layer 322, a cost function correlates a spatial relationship between forbidden regions 324 and a contour of cutting pattern 314. FIG. 6C is a simplified schematic diagrammatic view of a cost function defined for a target pattern based on a constraint layer, such as for cutting pattern 314 based on constraint layer 322 depicted in FIG. 6B, according to various aspects of the present disclosure. In FIG. 6C, an enlarged portion 332 of cutting pattern 314 defines a position P of a contour of target cut feature 316 (in particular, one of non-critical segments 328) relative to one of forbidden regions 324 (referred to as forbidden region F). A cost function 334 and/or a cost function 335 are defined according to position P of the contour of target cut feature 316 relative to forbidden region F, where cost function 334 and/or cost function 335 minimize penalty cost when position P does not intrude forbidden region F. Cost function 334 exhibits a cost curve 336 that exponentially increases as a contour of target cut feature 316 intrudes forbidden region F, where penalty cost is a minimum value (for example, zero) when position P of the contour of target cut feature 316 is greater than a position P1, while penalty cost gradually increases as position P transitions from position P1 to a position PF (which designates a boundary of forbidden region F) and significantly increases as position P is less than position PX, indicating that the contour of target cut feature 316 will expose forbidden region F. In contrast, cost function 335 exhibits a cost curve 337, where penalty cost is a minimum value when position P is greater than position PF or an infinite value when position P is less than or equal to position PF. Accordingly, when modifying cutting pattern 314, computational lithography method 300 can assign cost to the modified cutting pattern by evaluating a position of a modified target cut contour corresponding with the modified cutting pattern relative to constraint layer 322.

Turning again to FIG. 5, at block 340 and at block 350, computational lithography method 300 proceeds with modifying the target pattern and generating a modified target contour by simulating a lithography process using a mask that includes the modified target pattern. Various adjustments can be applied to the target pattern to create the modified target pattern, including but not limited to, resizing, reshaping, and/or relocating various features within the target pattern, along with adding and/or subtracting various features to the target pattern. Continuing with cutting pattern 314, computational lithography method 300 modifies cutting pattern 314 and then generates a modified target cut contour of target cut feature 316, where the modified target cut contour defines a shape of target cut feature 316 that will be printed (imaged) on a resist layer by exposing a cut mask including the modified cut pattern according to various lithographic process conditions. In some implementations, various process windows can be defined based on various process conditions, including but not limited to, defocus conditions, exposure conditions (energy bias), and/or mask conditions (mask bias) associated with imaging the modified target pattern (here, modified cutting pattern 314). In some implementations, the process windows define a range of defocus conditions, energy bias, and/or mask bias process window that permit acceptable lithographic quality of a feature corresponding with the modified target contour. In some implementations, at block 340, modifying the target pattern (generally referred to as a target optimization technique) can be performed along with OPC (an edge-based mask optimization technique), ILT (a pixel-based mask optimization technique), SMO (a source and a mask co-optimization technique), other lithography optimization techniques (for example, optimization techniques that focus on optimizing tool parameters and/or process parameters other than the mask and/or the source, such as film stack, pupil shape, exposure dose, other parameter, or combinations thereof), or combinations thereof.

At block 360, computational lithography method 300 proceeds with determining whether the modified target contour minimizes the cost function with acceptable process windows. In some implementations, computational lithography method 300 evaluates a spatial relationship between the modified target contour and the constraint layer to determine a penalty cost associated with the modified target contour. Recalling cutting pattern 314, in implementations where cost function 334 defines the penalty cost (FIG. 6C), a spatial relationship between the modified target cut contour of target cut feature 316 and constraint layer 322 is evaluated, for example, to determine a penalty cost associated with a position of the modified target cut contour. In such implementations, the modified target cut contour minimizes the penalty cost when positioned at a position greater than P1 relative to forbidden region F. In some implementations, computational lithography method 300 further evaluates whether the modified target contour fits the target contour at functional segments defined by the constraint layer. For example, the modified target cut contour is compared to target cut contour 318 at functional segments 326 to ensure that any variance in a position of the modified target cut contour and target cut contour at functional segments 326 falls within acceptable ranges (such as within acceptable EPE ranges). In some implementations, computational lithography method 300 further evaluates a process window associated with the modified target contour. For example, when a modified target contour that minimizes the cost function, process conditions associated with the minimized cost function can be evaluated to determine whether the process conditions fall within defined process windows. Process windows generally define a tolerance of lithographic imaging quality to process variations, such as focus variations, energy variations, and/or mask making variations associated with imaging the modified target pattern on a wafer (which exhibits the modified target contour). Larger process windows provide more tolerance to process variations, resulting in higher production yields. Focus variations, such as a drift in a z-direction, can defocus a projected wafer image, causing critical dimension (CD) variations and/or image contrast loss in the projected wafer image. In some implementations, CD variations with respect to defocus indicate focus drift tolerances, where a depth of focus (DoF) can be defined in a maximum focus drifting range where CD variations are controlled within a defined tolerance (for example, within a defined percentage). Energy variations, such as exposure dose variations, can cause CD variations and/or line edge roughness in the projected wafer image. In some implementations, CD variations with respect to exposure dose variations (such as energy drift) indicate energy bias tolerances, where various metrics related to critical dimension uniformity (CDU), line width roughness (LWR), and/or (EL) (for example, image contrast, image log slope (ILS), normalized image log slope (NILS)) can be implemented to evaluate such tolerances. Mask making variations, such as variations between a mask pattern and the modified target contour arising from a mask making process, can also cause CD variations in the projected wafer image. In some implementations, CD variations with respect to mask CD variations indicate mask bias tolerances, where various metrics (for example, mask enhanced error factor (MEEF)) can be implemented to evaluate such tolerances. In furtherance of some implementations, the process window can be evaluated with reference to other process variations, including aberration sensitivity (for example, CD variations with respect to drift of aberration Zernike terms), film stack sensitivity (for example, CD variations with respect to drift of refractive coefficient (n), absorption coefficient (k), and/or thickness (t) of the film stack and/or a material layer of the film stack), and/or other process variation metric.

If the modified target contour minimizes the cost function with acceptable process windows (for example, acceptable defocus, energy bias, and mask bias conditions) and/or otherwise complies with the constraint layer, computational lithography method 300 proceeds to block 370, where a mask is fabricated based on the modified target pattern, which corresponds with the modified target contour. The mask is fabricated by any suitable mask making process, such as those described herein, such that when the mask including the modified target pattern is exposed during a wafer fabrication process, a shape of a projected wafer image (such as projected wafer image 50) will correspond with the modified target contour. In some implementations, computational lithography method 300 identifies more than one modified target pattern that correspond with different modified target contours for minimizing the cost function with acceptable process windows. In such implementations, computational lithography method 300 can further include selecting the modified target contour having a best process window, where the mask is fabricated with the modified target pattern corresponding with the modified target contour having the best process window. In some implementations, the best process window ensures a variation of process conditions that will not cause failure in an IC device, such as defects and/or unacceptable drifts in electrical performance. For example, recalling cutting pattern 314, computational lithography method 300 can generate modified target patterns that correspond with contours of target cut feature 316 similar to cut feature A and cut feature C in FIG. 4, where computational lithography method 300 selects one of the modified target patterns. In some implementations, optimized process windows depend on process conditions and/or characteristics of a patterning layer represented by the modified target contour. For example, where the modified target contour corresponds with a first patterning layer (such as an active layer of the IC device), the first patterning layer free of topological concerns, such that it can tolerate smaller DoF and thus larger defocus conditions. In another example, where the modified target contour corresponds with a gate patterning layer, the gate patterning layer may require minimal energy bias (thus requiring high contrast, ILD, and/or NILS to minimize CD variation) to minimize CD variation, which can cause electrical properties drift, such as speed). In some implementations, process windows are optimized according to different metrics. For example, various metrics (such as DoF, ILD, and/or MEEF) can be determined, where the process windows are selected to minimize and/or maximize the various metrics at one or more locations and/or positions. In another example, perturbations are introduced into the lithography simulation (such as changes in defocus, energy bias, and/or mask bias) when generating the modified target contour, where the changes are minimized compared to nominal conditions while ensuring that the modified target contour complies with the constraint layer.

If the modified target contour does not minimize the cost function, the modified target contour cannot be achieved with acceptable process windows (for example, acceptable defocus, energy bias, and mask bias conditions), and/or the modified target contour otherwise fails to comply with the constraint layer, computational lithography method 300 returns to block 340, and computational lithography method 300 can iteratively modifies the target pattern until an optimized, modified target contour is generated.

Figure 7:
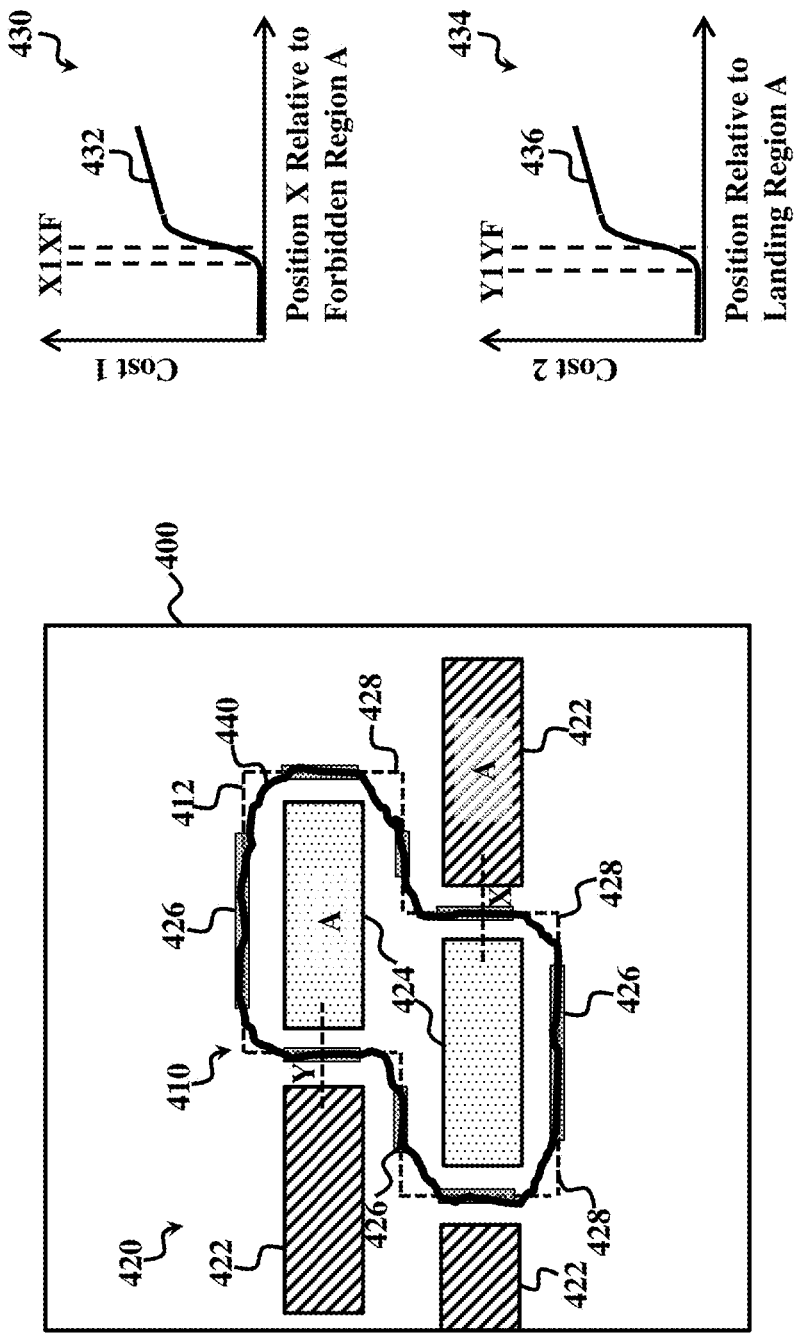
FIG. 7 is a simplified schematic diagrammatic view of a target pattern undergoing a computational lithography method, such as computational lithography method of FIG. 5, according to various aspects of the present disclosure.

Turning to FIG. 7, FIG. 7 is a simplified schematic diagrammatic view of an implantation pattern 400 undergoing a computational lithography method, such as computational lithography method 300, to generate an optimized implantation target feature according to various aspects of the present disclosure. Implantation pattern 400 includes a target implantation feature 410 having a target implantation contour 412, which defines an area of a wafer material layer to be implanted with doping species during an implantation process. An implantation mask including implantation pattern 400 can be fabricated to form doped features, such as active regions defining device areas of a substrate, in the wafer material layer of an IC device. To ensure desired functionality, an optimized target implantation contour of target implantation feature 410 fully exposes areas of the wafer material layer to be implanted with the doping species, while fully covering areas of the wafer material layer not to be implanted with the doping species. FIG. 7 has been simplified for the sake of clarity to better understand the inventive concepts of the present disclosure. Additional features can be added in implantation pattern 400, and some of the features described below can be replaced, modified, or eliminated for additional embodiments of implantation pattern 400.

In FIG. 7, implementing computational lithography method 300, a constraint layer 420 is defined based on functionality of the implantation pattern 400. For example, constraint layer 420 includes forbidden regions 422, landing regions 424, functional segments 426, and non-functional segments 428. Forbidden regions 422 define areas of implantation pattern 400 that the optimized target implantation contour of target implantation feature 410 cannot touch and/or overlap to ensure that target implantation feature 410 fully covers areas of the wafer material layer not to be implanted with the doping species. Landing regions 424 define areas of implantation pattern 400 that the optimized target implantation contour of target implantation feature 410 must overlap to ensure that target implantation feature 410 fully exposes areas of the wafer material layer to be implanted with the doping species. Functional segments 426 include edges of target implantation feature 410 that define dimensions of a doped feature to be formed in the wafer material layer, such as a critical dimension for the doped feature specified by an IC design layout. In contrast, non-functional segments 428 do not contribute to the functionality of implantation pattern 400, such that non-functional segments 428 can be modified without meaningfully affecting functional characteristics of the IC device.

A cost function is then defined based on constraint layer 420. In FIG. 7, a penalty cost 1 correlates a spatial relationship between one of forbidden regions 422 (referred to as forbidden region A) and a contour of target implantation feature 410, and a penalty cost 2 correlates a spatial relationship between one of landing regions 424 (referred to as landing region A) and a contour of target implantation feature 410. In some implementations, a cost function 430 is defined according to a position X of target implantation contour 412 relative to forbidden region A, where cost function 430 minimizes penalty cost 1 when position X does not intrude forbidden region A. For example, cost function 430 exhibits a cost curve 432 that increases as a contour of target implantation feature 410 intrudes forbidden region A. For example, penalty cost 1 is a minimum value when position X of the contour of target implantation feature 410 is less than a position X1, while penalty cost 1 gradually increases as position X transitions from position X1 to a position XF (which designates a boundary of forbidden region A) and significantly increases as position X is greater than position PX, indicating that the contour of target implantation feature 410 will expose forbidden region A. In some implementations, a cost function 434 is defined according to a position Y of target implantation contour 412 relative to landing region A, where cost function 434 minimizes penalty cost 2 when position Y does not fully cover landing region A. For example, cost function 434 exhibits a cost curve 436 that increases as a contour of target implantation feature 410 intrudes landing region A. For example, penalty cost 2 is a minimum value when position Y of the contour of target implantation feature 410 is less than a position Y1, while penalty cost 2 gradually increases as position Y transitions from position Y1 to a position YF (which designates a boundary of landing region A) and significantly increases as position Y is greater than position YX, indicating that the contour of target implantation feature 410 will not expose landing region A.

Computational lithography method 300 can then perform blocks 340-360, modifying implantation pattern 400 until a modified target implantation contour is generated that minimizes penalty cost 1 and/or penalty cost 2 while facilitating acceptable process windows. For example, computational lithography method iteratively modifies implantation pattern 400 until an optimized target implantation contour 440 is generated that minimizes penalty cost 1 and/or penalty cost 2 while facilitating acceptable process windows. In FIG. 7, optimized target implantation contour 440 fully covers forbidden regions 422 and fully exposes landing regions 424. Optimized implantation contour 440 also includes edges that exhibit minimal variance from target implantation contour 412 at functional segments 426, ensuring that an implantation mask fabricated with implantation pattern 400 as modified will meet critical dimension and/or overlay requirements specified by the IC design layout for the doped feature.

Figure 8:
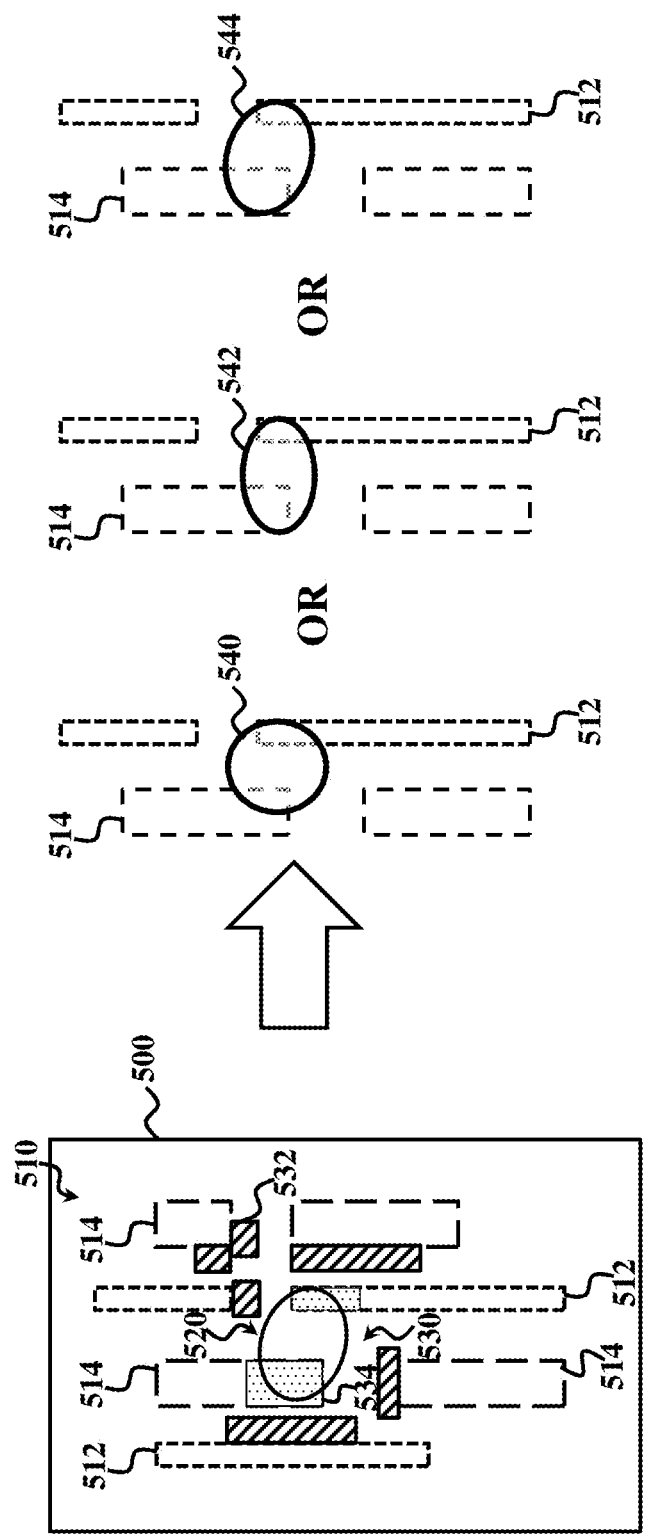
FIG. 8 is a simplified schematic diagrammatic view of another target pattern undergoing a computational lithography method, such as computational lithography method of FIG. 5, according to various aspects of the present disclosure.

Turning to FIG. 8, FIG. 8 is a simplified schematic diagrammatic view of a contact pattern 500 undergoing a computational lithography method, such as computational lithography method 300, to generate an optimized contact feature according to various aspects of the present disclosure. Contact pattern 500 is shown overlying a wafer material layer 510 that includes gate features 512 and source/drain features 514. Contact pattern 500 includes a target contact feature 520 having a target contact contour 522, which defines contact areas. A contact mask including contact pattern 500 can be fabricated to form a contact over wafer material layer 510, where the contact is configured to connect gate features 512 and source/drain features 514. In some implementations, the contact is a butted contact (BCT) fabricated to connect a gate and a source/drain of a static random access memory (SRAM)). To ensure desired functionality, an optimized target contact contour of target contact feature 520 sufficiently exposes areas of gate features 512 and source/drain features 514 for reliable electrical connection, while not exposing areas of gate features 512 and source/drain features 514 that degrade device performance (for example, by causing electrical shorts). FIG. 8 has been simplified for the sake of clarity to better understand the inventive concepts of the present disclosure. Additional features can be added in contact pattern 500, and some of the features described below can be replaced, modified, or eliminated for additional embodiments of implantation pattern 500.

In FIG. 8, implementing computational lithography method 300, a constraint layer 530 is defined based on functionality of contact pattern 500. For example, constraint layer 530 includes forbidden regions 532 and landing regions 534. Forbidden regions 532 define areas of contact pattern 500 that the optimized target contact contour of target contact feature 520 cannot expose to ensure that target contact feature 520 fully covers areas of wafer material layer 510 not intended for electrical connection. Landing regions 534 define areas of contact pattern 500 that the optimized target contact contour of target contact feature 520 must expose to ensure that target contact feature 520 sufficiently exposes areas of wafer material layer 510 intended for electrical connection. In contrast to other implementations, constraint layer 530 does not define any functional segments of target contact feature 520. Though not depicted, computational lithography method 300 then generates a cost function based on constraint layer 530, which defines a penalty cost that correlates a spatial relationship between forbidden regions 532 and a contour of target contact feature 520 and a penalty cost that correlates a spatial relationship between landing regions 534 and a contour of target contact feature 520. Computational lithography method 300 can then perform blocks 340-360, modifying contact pattern 500 to generate various modified target contact contours that minimize the cost function while facilitating acceptable process windows. For example, in FIG. 8, computational lithography method 300 can generate different modifications of contact pattern 500 that correspond with a generally circular-shaped target contact contour 540, a generally ellipsis-shaped target contact contour 542, and a tilted generally ellipsis-shaped contact contour 544, all of which minimize the cost function while facilitating acceptable process windows and electrically connect the portion of gate features 512 with source/drain features 514 despite having different shapes. In some implementations, at block 370, the modification of contact pattern 500 that corresponds with the modified target contact contour (for example, contour 540, contour 542, or contact 544) with the best process window is selected for fabricating a mask.

Figure 9:
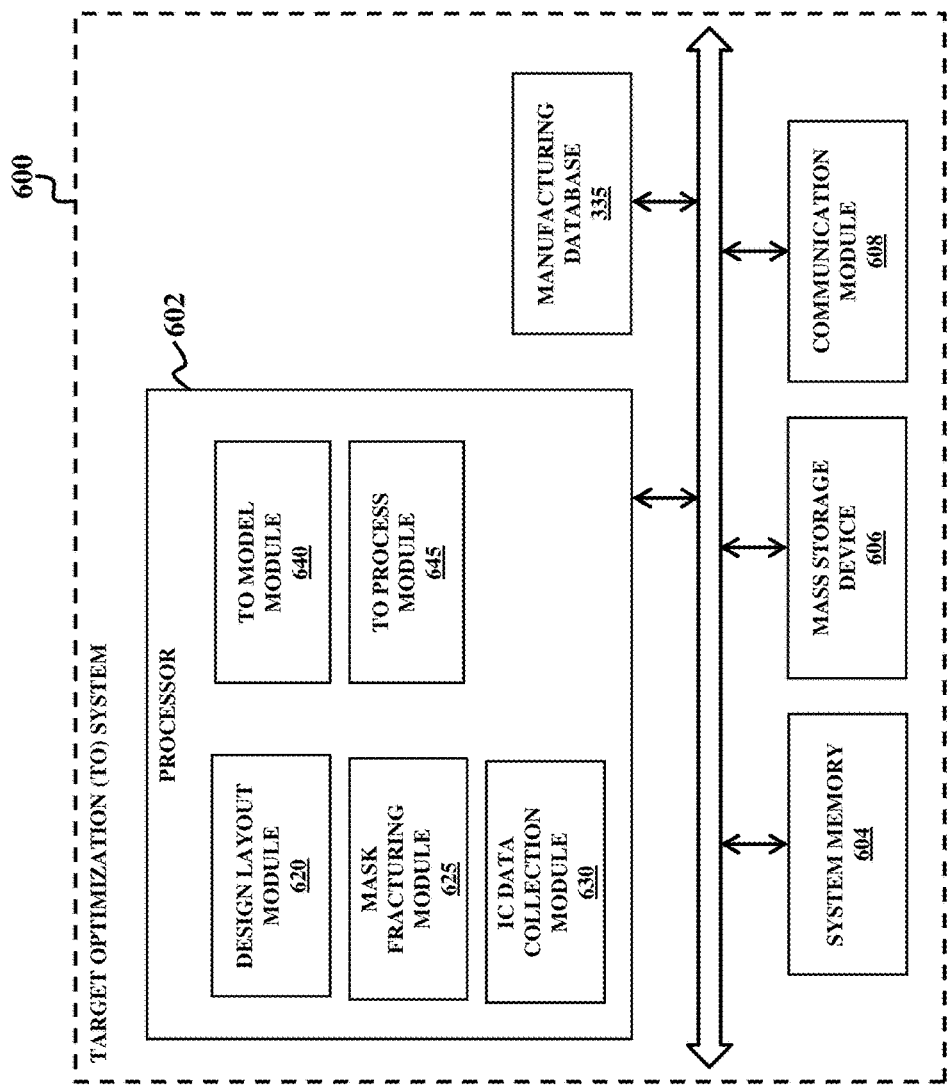
FIG. 9 is a simplified block diagram of a target optimization system, which can be implemented by IC manufacturing system 10 of FIG. 1, according to various aspects of the present disclosure.

Turning to FIG. 9, FIG. 9 is a simplified block diagram of a target optimization system 600, which can be implemented by IC manufacturing system 10 of FIG. 1, according to various aspects of the present disclosure. In some implementations, mask house 20 implements target optimization system 600, where target optimization system 600 is operable to perform functionalities described in association with mask data preparation 40 of FIG. 1. Target optimization system 600 includes both hardware and software integrated to perform various operations and/or functions for generating an optimized target pattern, as described herein. In some implementations, a computational lithography process, such as computational lithography process 300 of FIG. 5, may be implemented as software instructions executing on target optimization system 600. FIG. 9 has been simplified for the sake of clarity to better understand the inventive concepts of the present disclosure. Additional features can be added in target optimization system 600, and some of the features described below can be replaced or eliminated for additional embodiments of target optimization system 600.

Target optimization system 600 includes a processor 602 that is communicatively coupled to a system memory 604, a mass storage device 606, and a communication module 608. System memory 604 provides processor 602 with non-transitory, computer-readable storage to facilitate execution of computer instructions by processor 602. Examples of system memory 604 include random access memory (RAM) devices, such as dynamic RAM (DRAM), synchronous DRAM (SDRAM), solid state memory devices, and/or a variety of other memory devices. Computer programs, instructions, and data are stored on mass storage device 606. Examples of mass storage device 606 include hard discs, optical disks, magneto-optical discs, solid-state storage devices, and/or a variety of other mass storage devices. Communication module 608 is operable to communicate information with various components of IC manufacturing entities, such as design house 15, mask house 20, and IC fab 25 of IC manufacturing system 10. In FIG. 9, communication module 608 allows target optimization system 600 to communicate with a mask making system (such as e-beam lithography system) and a wafer making system (such as optical lithography system 60 of FIG. 2). Communication module 608 includes Ethernet cards, 802.11 WiFi devices, cellular data radios, and/or other communication devices for facilitating communication of target optimization system 600 with IC manufacturing entities.

Target optimization system 600 further includes an IC design layout module 620, a mask fracturing module 625, an IC data collection module 630, an IC manufacturing database 635, a target optimization (TO) model module 640, and a target optimization (TO) process module 645, which are communicatively coupled to carry out a target optimization process (such as computational lithography method 300). In operation, IC design layout module 620 receives an IC design layout that defines a target pattern (for example, from design house 15) and prepares the IC design layout for a target optimization process. IC data collection module 630 is configured to collect, store, and maintain IC manufacturing data, such as data from mask making processes associated with mask house 20 and wafer making processes associated with IC fab 25. The IC manufacturing data can be stored in IC manufacturing database 635. In some implementations, IC data collection module 330 analyzes the collected IC manufacturing data. In some implementations, analyzing the collected IC manufacturing data can include filtering out low quality IC manufacturing data (such as data deemed not reliable) and/or consolidating the manufacturing data into useful statistical IC manufacturing information (such as averaging). In some implementations, for illustration purposes only, the collected IC manufacturing data includes e-beam blur information, resist characteristic information (such as CDs associated with resist patterns after developing processes), etching bias information (such as CDs of wafer patterns after etching processes), and/or other useful IC manufacturing data.

TO model module 640 is configured to build a constraint layer and/or a cost function based on the constraint layer. TO model module 640 can use IC manufacturing data to generate the constraint layer, such as that stored by IC manufacturing database 635. TO model module 640 can store the constraint layer and/or cost function in an TO database (not shown). In some implementations, TO model module 640 performs various operations of computational lithography method 300, such as those described with reference to block 320 and block 330. In particular, TO model module 640 builds the constraint layer using the IC design layout and/or collected IC manufacturing data. Target optimization (TO) module 645 is configured to perform a target optimization process (such as computational lithography method 300) using the TO model, where the TO process module 645 optimizes the target pattern based on the constraint layer and the cost function. In some implementations, TO process module 645 performs various operations of computational lithography method 300, such as those described with reference to blocks 340-360. In some implementations, mask fracturing module 625 is configured to generate a mask shot map based on a mask pattern defined by the optimized target pattern (which corresponds with an optimized target contour), for example, by fracturing the optimized target pattern into mask regions (mask polygons) as described herein. The mask shot map defines exposure information, such as an exposure dose, for each mask region. In alternative implementations, mask fracturing module 625 can be eliminated, such that TO process module 645 generates the mask shot map for direct use by mask house 20.

Target optimization methods are disclosed herein for enhancing lithography printability. An exemplary target optimization method includes receiving an IC design layout for a target pattern, wherein the target pattern has a corresponding target contour; modifying the target pattern, wherein the modified target pattern has a corresponding modified target contour; and generating an optimized target pattern when the modified target contour achieves functionality of the target pattern as defined by a constraint layer. The method can further include defining a cost function based on the constraint layer, where the cost function correlates a spatial relationship between a contour of the target pattern and the constraint layer. In some implementations, the method further includes fabricating a mask based on the optimized target pattern. In some implementations, the method further includes fabricating a wafer using the mask.

In some implementations, the optimized target pattern is generated when the modified target contour minimizes the cost function. In some implementations, a penalty cost of the cost function increases as a position of the modified target contour approaches a boundary of the constraint layer. In some implementations, the constraint layer includes a forbidden region of the target pattern, wherein the forbidden region defines a portion of the target pattern that cannot be exposed by the modified target contour. In some implementations, the constraint layer includes a landing region of the target pattern, wherein the landing region defines a portion of the target pattern that must be exposed by the optimized target contour. In some implementations, constraint layer includes a functional segment of the target contour, wherein the functional segment contributes to functionality of the target pattern, and further wherein the modified target contour fits the target contour at the functional segment when the optimized target pattern is generated.

Another exemplary method includes receiving an IC design layout for a target pattern, wherein the target pattern has a corresponding target contour; defining a constraint layer based on a functionality of the target pattern; defining a cost function based on the constraint layer; modifying the target pattern, wherein the modified target pattern has a corresponding modified target contour; and generating an optimized target pattern when the modified target contour minimizes the cost function. In some implementations, the method further includes simulating a lithography process to generate the modified target contour, wherein the lithography processes uses a mask including the modified target pattern. In some implementations, the cost function correlates a spatial relationship between a contour of the target pattern and the constraint layer. In some implementations, defining the constraint layer includes defining a forbidden region of the target pattern, wherein the forbidden region defines a portion of the target pattern that cannot be exposed by the modified target contour. In such implementations, defining the cost function includes correlating a spatial relationship between the target contour and the forbidden region, wherein a penalty cost of the cost function increases as a position of the modified target contour approaches a boundary of the forbidden region. In some implementations, defining the constraint layer includes defining a landing region of the target pattern, wherein the landing region defines a portion of the target pattern to be exposed by the modified target contour. In such implementations, defining the cost function includes correlating a spatial relationship between the target contour and the landing region, wherein a penalty cost of the cost function increases as a position of the modified target contour approaches a boundary of the landing region.

An exemplary integrated circuit system includes a processor and a communication module communicatively coupled to the processor and configured to receive an IC design layout that defines a target pattern. The system also includes non-transitory, computer-readable storage communicatively coupled to the processor and including instructions executable by the processor. The instructions include instructions to modify the target pattern, wherein the modified target pattern has a corresponding modified target contour; and instructions to generate an optimized target pattern when the modified target contour achieves functionality of the target pattern as defined by a constraint layer. In some implementations, the instructions also include instructions to define a cost function based on the constraint layer, wherein the cost function correlates a spatial relationship between a contour of the target pattern and the constraint layer. In some implementations, the instructions also include instructions to define the constraint layer, wherein the constraint layer includes a forbidden region of the target pattern, the forbidden region defining a portion of the target pattern that cannot be exposed by the modified target contour. In some implementations, the instructions also include instructions to iteratively modify the target pattern until the modified target contour achieves functionality of the target pattern as defined by the constraint layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving an IC design layout for a target pattern given ideal processing conditions, wherein the target pattern includes a target feature having a target contour;
modifying the target contour of the target feature to compensate for processing conditions that cause a fabricated pattern to vary from the target pattern;
generating an optimized target pattern when the modified target contour of the target feature achieves functionality of the target pattern as defined by a constraint layer, wherein the constraint layer defines a portion of the target pattern that constrains the modified contour of the target feature; and
fabricating a mask based on the optimized target pattern.

2. The method of claim 1, further comprising defining a cost function based on the constraint layer, wherein the cost function correlates a spatial relationship between a contour of the target feature and the constraint layer.

3. The method of claim 2, wherein the optimized target pattern is generated when the modified target contour of the target feature minimizes the cost function.

4. The method of claim 2, wherein a penalty cost of the cost function increases as a position of the modified target contour of the target feature approaches a boundary of the constraint layer.

5. The method of claim 2, wherein the cost function is further based on a defocus, an energy bias, and a mask bias associated with the modified target contour of the target feature.

6. The method of claim 1, wherein the constraint layer includes a forbidden region of the target pattern, wherein the forbidden region defines a portion of the target pattern that cannot be touched by the modified target contour of the target feature.

7. The method of claim 1, wherein the constraint layer includes a landing region of the target pattern, wherein the landing region defines a portion of the target pattern that must be covered by the modified target contour of the target feature.

8. The method of claim 1, wherein the constraint layer includes a functional segment of the target contour, wherein the functional segment contributes to functionality of the target pattern, and further wherein the modified target contour of the target feature fits the target contour at the functional segment when the optimized target pattern is generated.

9. The method of claim 1, wherein the target pattern includes a cut pattern and an IC feature pattern, the target feature is a cut feature, and the constraint layer defines a portion of the IC feature pattern that constrains the modified target contour of the cut feature.

10. The method of claim 1, further comprising fabricating a wafer using the mask and processing parameters associated with minimizing a cost function that is defined based on the constraint layer.

11. A method comprising:
receiving an IC design layout for a target pattern given ideal processing conditions;
defining a constraint layer based on a functionality of the target pattern, wherein the constraint layer defines a portion of the target pattern that constrains a contour of a target feature of the target pattern when modified to compensate for processing conditions that cause a fabricated pattern to vary from the target pattern;
defining a cost function that correlates a spatial relationship between the contour of the target feature and the constraint layer;
modifying a target contour of the target feature using the constraint layer and the cost function;
generating an optimized target pattern when the modified target contour of the target feature minimizes the cost function; and
fabricating a mask based on the optimized target pattern.

12. The method of claim 11, wherein the target pattern defines a first pattern layer and a second pattern layer for forming an IC feature defined by the IC design layout, the target feature is a portion of the second pattern layer, and the constraint layer defines a portion of the first pattern layer that constrains the target feature.

13. The method of claim 11, further comprising simulating a lithography process to simulate the fabricated pattern, wherein the lithography process uses a mask including the target feature having the modified target contour.

14. The method of claim 11, wherein:
defining the constraint layer includes defining a forbidden region of the target pattern, wherein the forbidden region defines a portion of the target pattern that cannot be touched by the contour of the target feature; and
defining the cost function includes correlating a spatial relationship between the contour of the target feature and the forbidden region, wherein a penalty cost of the cost function increases as a position of the modified target contour approaches a boundary of the forbidden region.

15. The method of claim 11, wherein:
defining the constraint layer includes defining a landing region of the target pattern, wherein the landing region defines a portion of the target pattern to be covered by the contour of the target feature; and
defining the cost function includes correlating a spatial relationship between the contour of the target feature and the landing region, wherein a penalty cost of the cost function increases as a position of the modified target contour approaches a boundary of the landing region.

16. The method of claim 11, wherein:
defining the constraint layer includes defining a functional segment of the target contour of the target feature, wherein the functional segment contributes to functionality of the target pattern; and
generating the optimized target pattern includes fitting the modified target contour of the target feature to the target contour of the target feature at the functional segment.

17. A method comprising:
defining a constraint layer for a first pattern layer that corresponds with a target pattern defined by an integrated circuit (IC) layout, wherein the constraint layer constrains a contour of a target feature of the first pattern layer based on a second pattern layer that corresponds with the target pattern;
iteratively modifying a contour of the target feature until a simulated fabricated pattern functions substantially similar to the target pattern, thereby generating an optimized first pattern layer that includes the target feature having the modified target contour; and
generating a mask based on the optimized first pattern layer.

18. The method of claim 17, further comprising defining a cost function based on the constraint layer, wherein the cost function correlates a spatial relationship between a contour of the target feature and a target feature of the second pattern layer.

19. The method of claim 17, wherein the constraint layer includes a forbidden region of the second pattern layer, the forbidden region defining a portion of the second pattern layer that cannot be touched by the contour of the target feature.

20. The method of claim 17, wherein at each iteration, a lithography process is simulated using a mask that includes the target feature having a respective modified contour to generate the simulated fabricated pattern.

* * * * *